United States Patent
Suzuki et al.

(10) Patent No.: US 8,794,548 B2
(45) Date of Patent: Aug. 5, 2014

(54) FORMATION METHOD OF WATER REPELLENT LAYER AND INJECTOR HAVING WATER REPELLENT LAYER

(75) Inventors: Kazunori Suzuki, Nagoya (JP); Susumu Sobue, Obu (JP); Yoshihito Mitsuoka, Toyota (JP)

(73) Assignee: Denso Corporation, Kariya (JP)

( * ) Notice: Subject to any disclaimer, the term of this patent is extended or adjusted under 35 U.S.C. 154(b) by 1053 days.

(21) Appl. No.: 12/715,751

(22) Filed: Mar. 2, 2010

(65) Prior Publication Data

US 2010/0224706 A1 Sep. 9, 2010

(30) Foreign Application Priority Data

Mar. 5, 2009 (JP) .................................. 2009-52453

(51) Int. Cl.
*B05B 1/30* (2006.01)

(52) U.S. Cl.
USPC ........................................ 239/584; 239/591

(58) Field of Classification Search
CPC F02M 61/18; F02M 61/1886; F02M 61/1893
USPC ........ 239/584, 591, 589, 533.11; 29/890.124, 29/890.127
See application file for complete search history.

(56) References Cited

U.S. PATENT DOCUMENTS

| 4,742,964 | A | * | 5/1988 | Ito et al. ..................... 239/397.5 |
| 4,871,434 | A | * | 10/1989 | Munz et al. ............. 204/192.16 |
| 5,777,438 | A | * | 7/1998 | Suzuki ..................... 315/111.81 |
| 7,026,009 | B2 | * | 4/2006 | Lin et al. ............................ 427/8 |
| 7,383,792 | B1 | * | 6/2008 | Sharpe .......................... 123/1 A |
| 2003/0000825 | A1 | * | 1/2003 | Koh et al. ..................... 204/165 |
| 2007/0148407 | A1 | * | 6/2007 | Chen et al. ................... 428/141 |
| 2008/0132060 | A1 | * | 6/2008 | Luoh et al. ................... 438/653 |
| 2009/0159728 | A1 | * | 6/2009 | Suzuki et al. ................. 239/584 |

FOREIGN PATENT DOCUMENTS

| JP | 5-24887 | 2/1993 |
| JP | 10-159688 | 6/1998 |
| JP | 2001-199069 | 7/2001 |
| JP | 2005-89771 | 4/2005 |
| JP | 2005-254637 | 9/2005 |
| JP | 2006-161731 | 6/2006 |

* cited by examiner

*Primary Examiner* — Davis Hwu
(74) *Attorney, Agent, or Firm* — Nixon & Vanderhye P.C.

(57) ABSTRACT

A formation method for forming a water repellent layer on a surface of a metal substrate forms asperities on a surface of a metal basis material of the metal substrate by irradiating the metal basis material with plasma ions. The formation method forms an alloy from atoms of a metal of the metal basis material and the plasma ions. The formation method forms the asperities with portions of the metal basis material, which are not etched due to the alloy, and portions of the metal basis material, which are not alloyed but are etched. The formation method forms the water repellent layer by forming the asperities.

15 Claims, 5 Drawing Sheets

US 8,794,548 B2

FORMATION METHOD OF WATER REPELLENT LAYER AND INJECTOR HAVING WATER REPELLENT LAYER

CROSS REFERENCE TO RELATED APPLICATION

This application is based on and incorporates herein by reference Japanese Patent Application No. 2009-52453 filed on Mar. 5, 2009.

BACKGROUND OF THE INVENTION

1. Field of the Invention

The present invention relates to a formation method of a water repellent layer and to an injector having the water repellent layer.

2. Description of Related Art

There is known an injector that injects fuel directly into a cylinder of an internal combustion engine, for example, as described in Patent document 1 (JP-A-H10-159688). This type of injector has an injection hole forming section that forms an injection hole. The injector injects the fuel from the injection hole into a combustion chamber of the cylinder directly under the injection hole.

According to the technology of the injector described in Patent document 1, an inner periphery of the injection hole and a circumference of the injection hole in the injection hole forming section are coated with a FAS coating consisting of fluoroalkyl silane (hereafter, referred to as FAS). According to the technology, the FAS coating has water repellency because of existence of fluoroalkyl groups and enables inhibition of adhesion of deposits to the inner periphery of the injection hole and the circumference of the injection hole.

However, there is a concern that the adhesion inhibition function to inhibit the deposits, which are generated in the combustion chamber, from adhering to the injection hole falls for a following reason in the conventional technology of Patent document 1. That is, the FAS coating having the water repellency is coated on the injection hole, and the injection forming section is in an environment where the injection hole forming section is exposed to a hot gas in the combustion chamber. Therefore, a surface of the injection hole forming section on the combustion chamber side is brought to a high temperature state, and therefore the FAS coating degrades thermally. If the thermal degradation of the FAS coating occurs, the deposit adhesion inhibition function to inhibit the deposits from adhering to the injection hole falls.

Studies performed by the inventors of the present invention about the above-described FAS coating revealed that the fluoroalkyl group consisting of an organic macromolecule containing the fluorine starts thermal decomposition at relatively low temperature (approximately 250 degrees C.) as compared to temperature on the combustion chamber side surface of the injection hole forming section. The inventors think that the fall of durability concerning heat resistance is caused because the water repellent function of the FAS coating is provided by the above-described organic macromolecule.

SUMMARY OF THE INVENTION

It is an object of the present invention to provide a formation method of a water repellent layer capable of improving durability concerning heat resistance and ensuring inhibition of deposit adhesion to an injection hole at the same time and an injector having the water repellent layer.

According to a first example aspect of the present invention, a formation method for forming a water repellent layer on a surface of a metal substrate forms asperities on a surface of a metal basis material of the metal substrate by irradiating the metal basis material with plasma ions. The method includes the steps of forming an alloy from a metal of the metal basis material and the plasma ions, forming the asperities with portions of the metal basis material, which are not etched because of the alloy, and portions of the metal basis material, which are not alloyed but are etched, and forming the water repellent layer by forming the asperities.

According to the above-described aspect of the present invention, the water repellent layer having the fine asperities is formed by irradiating the surface of the metal basis material of the metal substrate with the plasma ions. Such the water repellent layer is not made of the organic substances but is made of the inorganic substances containing the metal. Therefore, the heat resistance can be improved as compared to the conventional water repellent layer consisting of the organic substances.

When the metal basis material is irradiated with the plasma ions, metal atoms of the metal basis material are flicked off due to collision with the plasma ions. Thus, the surface of the metal basis material is etched. If the plasma ion collides with the metal atom floating above the surface out of the metal atoms that are flicked off, the metal atom and the plasma ion join together to form an alloy. Such the alloy does not have an energy enough to flick off the metal atom when the alloy collides with the metal basis material. Therefore, the alloy adheres to the metal basis material.

Since the alloy portions adhering to the metal basis material are not etched, protruded portions of the fine asperities are surely formed. An air layer is formed among the protruded portions in the fine asperities. Therefore, the water repellent layer can be formed by forming the fine asperities.

According to the above-described first example aspect of the present invention, the water repellent layer that is capable of improving the durability concerning the heat resistance and ensuring the inhibition of the deposit adhesion to the injection hole at the same time can be formed.

According to a second example aspect of the present invention, the asperities include protruded portions, each of which is formed in the shape of a columnar protrusion extending along a conical shape. With such the construction, when the deposit adheres to the water repellent layer (i.e., asperities), an adhesion ratio of the protruded portions can be reduced as compared to an adhesion ratio of the air layer, which exists among the protruded portions, between the adhesion ratios of the air layer and the protruded portions. Accordingly, water repellency can be improved and the effect of the deposit adhesion inhibition can be heightened.

According to a third or fourth example aspect of the present invention, the metal is at least a metallic material selected from a metallic material group consisting of the aluminum (Al), the silver (Ag), the zinc (Zn), the nickel (Ni), the copper (Cu) and the magnesium (Mg).

Accordingly, at least a metallic material selected from the metallic material group consisting of the aluminum, the silver, the zinc, the nickel, the copper and the magnesium can be used as the metal, which collides with the plasma ion to form the alloy.

Each of the above-described aluminum, the silver, the zinc, the nickel, the copper and the magnesium has relatively low oxidization resistance. Therefore, it is preferable to perform heating and oxidization of the metal substrate consisting of such the metal in an oxidative atmosphere after forming the asperities on the metal substrate as in the fourth example aspect of the present invention. Thus, the water repellent layer that ensures the inhibition of the deposit adhesion to the injection hole while improving the durability concerning the oxidization resistance and the heat resistance can be formed.

According to a fifth example aspect of the present invention, the metal is at least a metallic material selected from a metallic material group consisting of the platinum (Pt), the iridium (Ir), the gold (Au), the palladium (Pd) and the rhodium (Rh), a metallic material group consisting of the tungsten (W), the molybdenum (Mo), the tantalum (Ta), the niobium (Nb) and the rhenium (Re) or a metallic material group consisting of the chromium (Cr) and the titanium (Ti).

With the above-described construction, at least a metallic material selected from the metallic material group of the noble metals such as the platinum, the iridium, the gold, the palladium and the rhodium, the metallic material group consisting of the metals having relatively high melting points such as the tungsten, the molybdenum, the tantalum, the niobium and the rhenium or the metallic material group consisting of the metals having relatively high oxidation resistance such as the chromium and the titanium can be used as the metal, which collides with the plasma ion to form the alloy.

According to a sixth example aspect of the present invention, the water repellent layer is formed on a surface of a covered member that has an inner main body and the metal substrate covering a surface of the inner main body.

With the above construction, a portion other than the main body of the covered member is formed of the metal substrate. Therefore, only the portion of the covered member that requires the water repellent layer can be constituted by the metal substrate. Eventually, the amount of the metal material used in the metal substrate can be suppressed.

According to a seventh example aspect of the present invention, the inner main body of the covered member is formed of an iron-based base material including the iron. Thus, the inner main body of the covered member to be covered by the metal substrate can be formed of the iron-based base material including the iron such as the stainless steel.

According to an eighth example aspect of the present invention, an injector having an injection hole for injecting fuel has a water repellent layer provided at least on an injection hole inner wall surface of the injection hole and a circumference of an opening of the injection hole. The water repellent layer is formed by the above-described formation method.

With such the construction, the injection hole inner wall surface of the injection hole and the circumference of the opening of the injection hole can maintain the deposit adhesion inhibition function over a long period of time.

BRIEF DESCRIPTION OF THE DRAWINGS

Features and advantages of an embodiment will be appreciated, as well as methods of operation and the function of the related parts, from a study of the following detailed description, the appended claims, and the drawings, all of which form a part of this application. In the drawings:

DETAILED DESCRIPTION OF EXAMPLE EMBODIMENT

Hereinafter, an embodiment of the present invention will be described with reference to the drawings.

Figure 1:
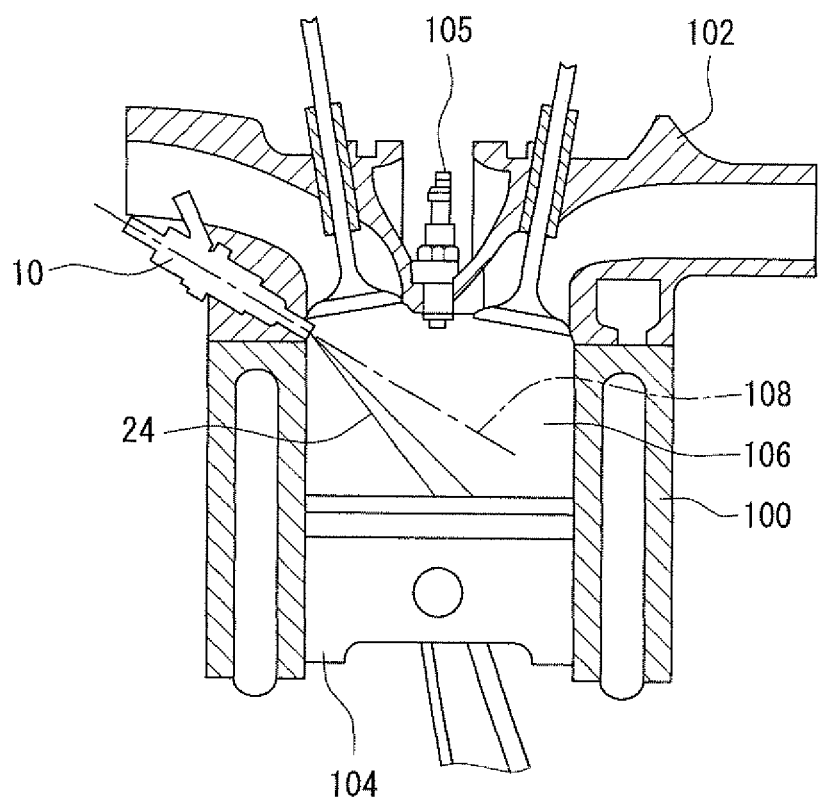
FIG. 1 is a cross-sectional view showing an arrangement position of an injector to an internal combustion engine and a spray of the injector into a combustion chamber according to an embodiment of the present invention.

An injector 10 is fixed to a cylinder head 102 as shown in FIG. 1. The injector 10 is an injector for a direct injection gasoline engine that injects fuel directly into a combustion chamber 106 defined by a wall surface of the cylinder head 102, an inner wall surface of a cylinder block 100 and an upper end surface of a piston 104. The fuel pressurized to pressure equivalent to fuel injection pressure with a fuel supply pump (not shown) is supplied to the injector 10. The fuel pressure is set at predetermined pressure in the range from 1 MPa to 40 MPa. The injector 10 injects the fuel at the fuel injection pressure corresponding to the range into the combustion chamber 106.

A fuel spray 24 injected from the injector 10 should be preferably atomized such that the fuel spray 24 is dispersed in the combustion chamber 106. For example, a basic shape of the fuel spray 24 is a hollow conical shape. The spray shape is formed by appropriately setting a shape, arrangement and the like of an injection hole provided on a tip end side of the injector 10.

The injector 10 is mounted to a wall surface of a corner of the combustion chamber 106 at a slant. A fuel injection direction of the injector 10, i.e., the spray 24, is inclined with respect to a central axis 108 of the injector 10 such that the fuel injection direction comes away from the central axis 108 toward the end surface of the piston 104. An angle of the inclination of the spray 24 with respect to the central axis 108 of the injector 10 is suitably set at the optimum angle to inhibit the fuel of the spray 24 from adhering to a spark plug 105 and the inner wall surface of the combustion chamber 106.

Figure 2:
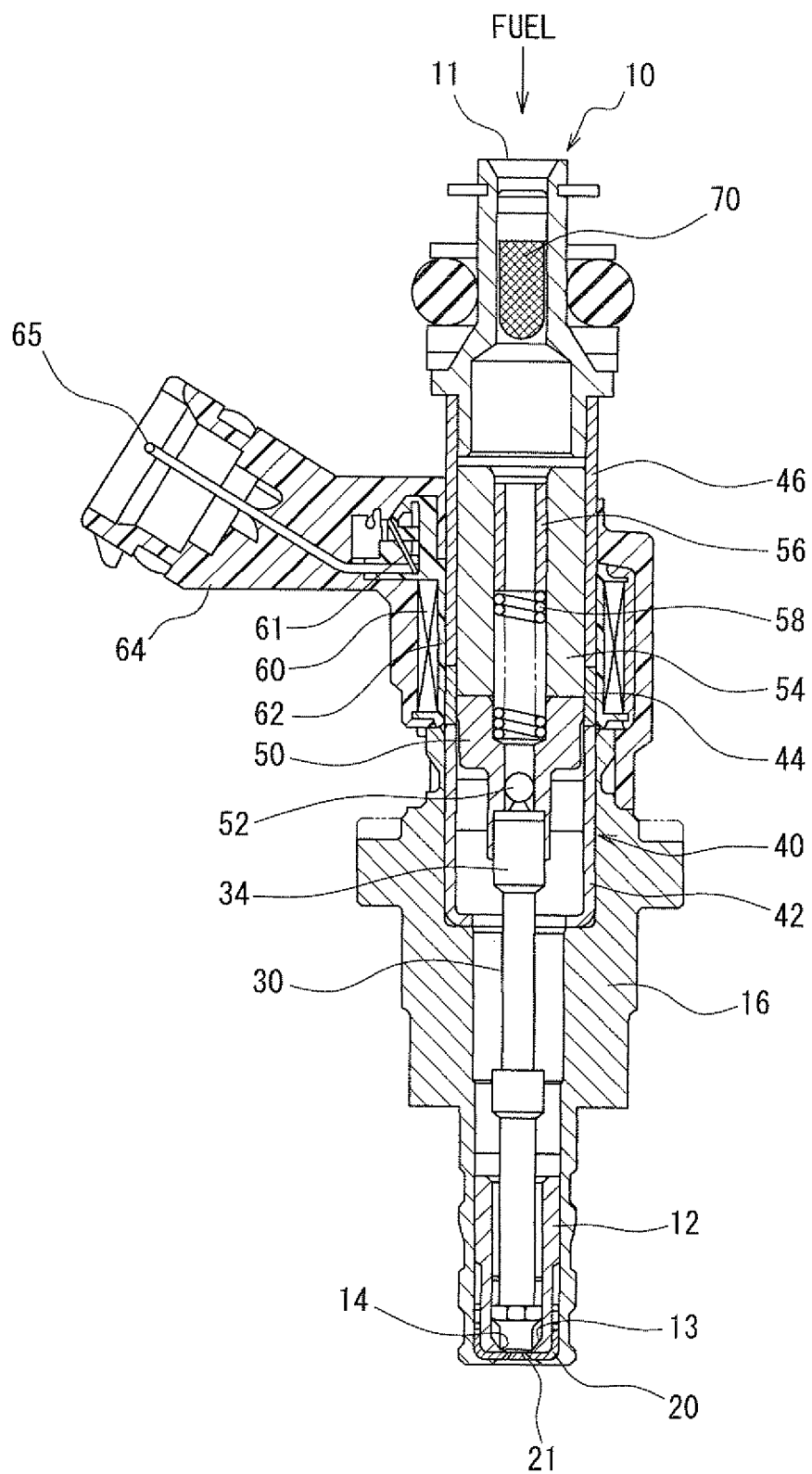
FIG. 2 is a cross-sectional view showing the injector having a water repellent layer according to the embodiment.

As shown in FIG. 2, a valve body 12 is fixed to an inner wall of an end portion of a valve housing 16 on the injection hole side by a welding process or the like. The valve body 12 has a conical surface 13, which defines a fuel passage and which has a diameter reducing downstream of a fuel flow. A valve seat 14 is formed on the conical surface 13. A valve member 30 is seated on and separates from the valve seat 14.

An injection hole plate 20 as an injection hole forming section has injection holes 21. The injection hole plate 20 is provided as an integral body with the valve body 12 or is provided integrally with the valve body 12 in a tip end of the injector 10. The injection hole plate 20 is formed in the shape of a cylinder having a bottom as shown in FIG. 2. The injection hole plate 20 is integrally held between an inner wall of a bottom portion of the valve housing 16 and an outer wall of a bottom portion of the valve body 12.

A cylinder member 40 is constituted by a first magnetic cylinder portion 42, a nonmagnetic cylinder portion 44 and a second magnetic cylinder portion 46 arranged in that order from the injection hole plate 20 side. The nonmagnetic cylinder portion 44 prevents a magnetic short circuit between the first magnetic cylinder portion 42 and the second magnetic cylinder portion 46.

A movable core 50 is formed of a magnetic material in a cylindrical shape. The movable core 50 is fixed to an end portion 34 of the valve member 30 on a side opposite to the injection holes 21 by a welding process or the like. The movable core 50 and the valve member 30 reciprocate in conjunction with each other. The movable core 50 has a communication passage 52 that penetrates through an inside of the movable core 50 and that communicates with a fuel passage. A fixed core 54 is formed of a magnetic material and is arranged coaxially with the movable core 50. The fixed core 54 is inserted into the cylinder member 40 and is fixed with the cylinder member 40 by a welding process or the like.

An adjusting pipe 56 is structured to be fixed to the fixed core 54, for example, by press-fitting or the like. The adjusting pipe 56 defines a fuel passage inside. A spring 58 is arranged such that both ends of the spring 58 are held between the movable core 50 and the adjusting pipe 56. The spring 58 pushes the movable core 50 and the valve member 30 in a direction for seating the valve member 30 on the valve seat 14. A biasing force of the spring 58 is adjusted by adjusting a press-fitting amount of the adjusting pipe 56, which is press-fit into the fixed core 54.

A drive coil 60 has a coil 61 and a spool 62. The spool 62 is formed of a resin material in a cylindrical shape, and the coil 61 is wound around an outer periphery of the spool 62. Both ends of the wound coil 61 are electrically connected with terminals 65 of a connector 64. The fixed core 54 is provided radially inside the drive coil 60 across the cylinder member 40.

When the drive coil 60 is not energized, the movable core 50 and the valve member 30 are pushed toward the valve seat 14 side, and a seated portion of the valve member 30 is seated on the valve seat 14. Thus, the fuel injection from the injection holes 21 is blocked. If the drive coil 60 is energized, the movable core 50 is attracted by the fixed core 54 and the valve member 30 separates from the valve seat 14. Thus, the fuel is injected from the injection holes 21.

Hereafter, the state where the valve member 30 is separate from the valve seat 14 will be referred to as a lifting state of the valve member 30. A lift amount of the valve member 30 is decided by an air gap between magnetic pole faces of the movable core 50 and the fixed core 54.

The fuel (gasoline fuel, in the present embodiment) is supplied to a fuel inlet 11 of the injector 10 by the above-described fuel supply pump. The fuel supplied to the fuel inlet 11 flows through a filter 70 that removes extraneous matters and flows radially inside the cylinder member 40, the valve housing 16 and the valve body 12.

The above is the explanation of the basic structure of the injector 10 according to the present embodiment. Next, characteristic construction of the injector 10 according to the present embodiment will be explained.

(Characteristic Construction of Injector 10)

Figure 3:
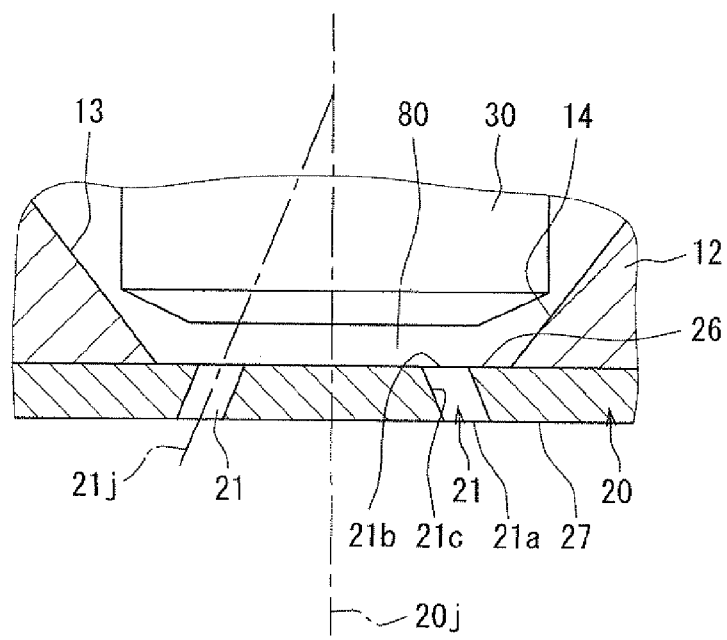
FIG. 3 is a cross-sectional view showing a circumference of an injection hole forming section of the injector according to the embodiment.

As shown in FIG. 3, the injection hole plate 20 is fixed to the tip end portion of the valve body 12 integrally or as an integral body with the valve body 12. The injection hole plate 20 has the multiple injection holes 21 radially inside the conical surface 13. The multiple injection holes 21 penetrate through the injection hole plate 20 to open in both of an inner wall surface 26 and an outer wall surface 27. The fuel supplied to the fuel inlet 11 is injected from the injection holes 21 into the combustion chamber 106 of the engine.

FIG. 3 is a cross-sectional view showing a circumference of the injection hole plate 20 of the injector 10 and shows the tip end portion of the valve body 12 of FIG. 2 in an enlarged scale. As shown in FIG. 3, inlet portions 21b of the multiple injection holes 21 are arranged in the shape of a single ring on the same virtual circle. The center of the virtual circle coincides with the central axis 108 of the injector 10 and substantially coincides with a central axis 20j of the valve body 12 and the injection hole plate 20.

The injection holes 21 are formed radially inside a concave portion defined by the conical surface 13 and the injection hole plate 20. A fuel chamber 80 defined by the concave portion and the valve member 30 is formed substantially in a cylindrical shape. The fuel in the fuel passage flowing from the valve seat 14 side toward the injection holes 21 when the valve member 30 is separate from the valve seat 14 flows into the fuel chamber 80. The fuel chamber 80 facilitates distribution of the fuel, which flows into the fuel chamber 80, to the respective injection holes 21.

A direction of a central axis 21j of the injection hole 21 should be preferably inclined such that an outlet portion 21a of the injection hole 21 is farther from the central axis 21j of he injection hole plate 20 than the inlet portion 21b.

The injection hole plate 20 consists of a main body portion 22 and a water repellent layer 23 covering the main body portion 22. The water repellent layer 23 is provided on the outer wall surface 27 of the injection hole plate 20. The water repellent layer 23 has a function to raise and repel liquid droplets of water, oil such the fuel and the like from its surface.

If residual fuel remains in the injection hole 21 after the end of the fuel injection from the injection hole 21, the residual fuel can become a core of deposit. The water repellent layer 23 provided on a circumference of the outlet portion 21a of the injection hole 21 moves or flicks off (or repels) the residual fuel to an outside of the circumference other than the outlet portion 21a. Even if the deposit adheres to an injection hole inner wall surface 21c of the injection hole 21, the deposit can be removed from the injection hole inner wall surface 21c by a force of the fuel at the time of the injection, i.e., the fuel injection pressure, when the fuel is injected.

In this way, by providing the water repellent layer 23 on the circumference of the outlet portion 21a of the injection hole 21, the residual fuel adhering to the circumference of the outlet portion 21a of the injection hole 21 can be reduced, and eventually, the deposit adhesion to the outlet portion 21a of the injection hole 21 can be inhibited.

Figure 4:
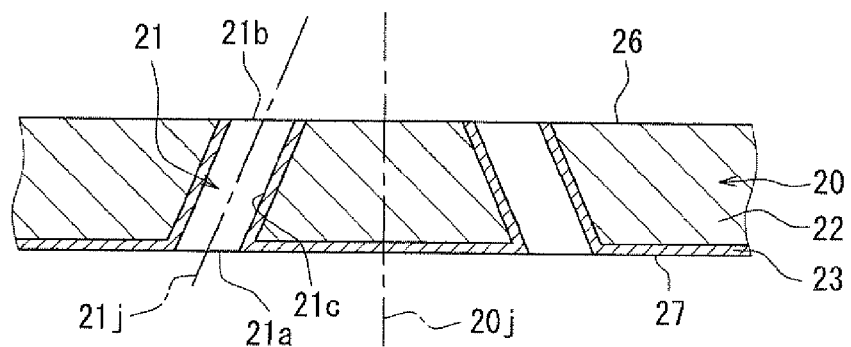
FIG. 4 is a cross-sectional view showing the injection hole forming section having the water repellent layer according to the embodiment.

The wall surface area of the injection hole plate 20 where the water repellent layer 23 is provided is not limited to the outer wall surface 27 on the combustion chamber 106 side. The water repellent layer 23 may be provided at least in a wall surface area of the injection hole inner wall surface 21c and the outer wall surface 27 as shown in FIG. 4. With such the construction, the deposit adhesion can be inhibited in the wall surface area of the injection hole inner wall surface 21c and the outer wall surface 27. Thus, accumulation of multiple thin layers of the deposit on the injection hole inner wall surface 21c due to repetition of execution and suspension of the fuel injection can be inhibited.

The main body portion 22 of the above-described injection hole plate 20 is formed of an iron-based metal material such as the stainless steel (SUS according to Japanese Industrial Standards). The water repellent layer 23 is formed on a substrate 231 that is formed of a metallic material different from that of the main body portion 22. The substrate 231 is formed on the main body portion 22 by plating processing or deposition processing and covers the above-described wall surface area. In the present embodiment, the water repellent layer 23 is formed as an integral body with the substrate 231. The substrate 231 corresponds to a metal substrate.

Figure 5:
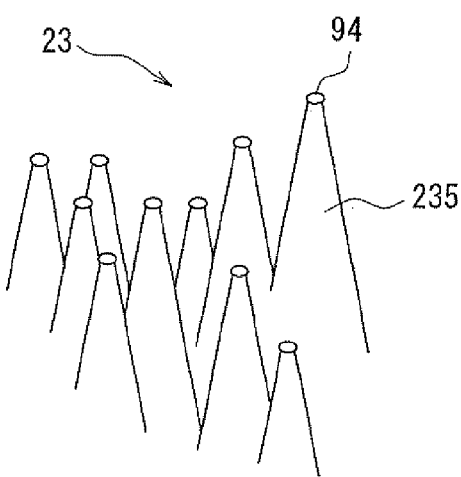
FIG. 5 is a perspective view showing asperities formed in the water repellent layer according to the embodiment.

The water repellent layer 23 has an asperity structure consisting of fine depressed portions and protruded portions (i.e., fine asperities) on the outer wall surface 27 as shown in FIG. 5. The asperity structure includes protruded portions 235, each of which is a columnar protrusion extending along a conical shape. The protruded portions 235 extend from a bottom portion of the substrate 231 toward the combustion chamber 106 side (in downward direction in FIG. 4 and in upward direction in FIG. 5).

Figure 6:
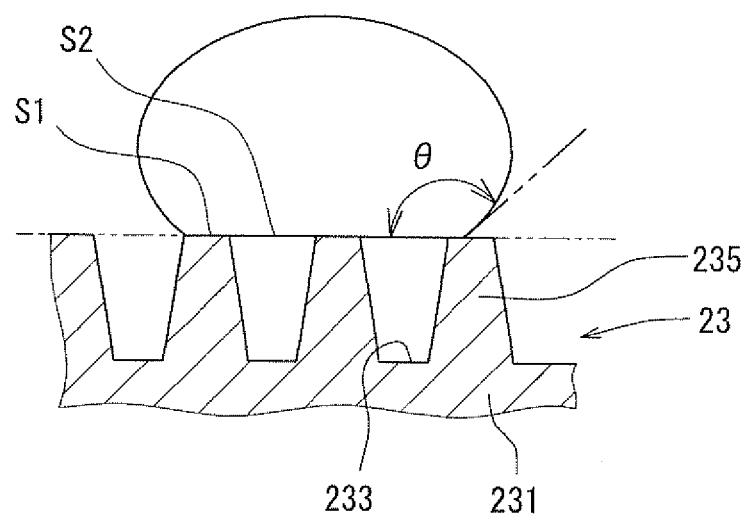
FIG. 6 is a diagram illustrating a contact angle in an asperity structure according to the embodiment.

FIG. 6 schematically shows the asperity structure of the water repellent layer 23. Fine depressed portions 233 and protruded portions 235, which are sufficiently smaller than the size of the liquid droplet of the fuel, are formed on the surface of the substrate 231 in the asperity structure.

As shown in FIG. 6, the fuel droplet contacts the protruded portions 235 and an air layer formed among the protruded portions 235. The droplet is supported by top surfaces of the protruded portions 235 and a surface of the air layer. A ratio of a contact area, in which the top surfaces of the protruded portions 235 contact the liquid droplet, to an area of the surfaces contacting the liquid droplet will be designated with S1. A ratio of an area, in which the surface of the air layer contacts the liquid droplet, to the area of the surfaces contacting the liquid droplet will be designated with S2. A true contact angle of the metallic material of the protruded portion 235 (i.e., substrate 231) will be designated with θ1, and a true contact angle of the air layer will be designated with θ2.

A contact angle θ of the water repellent layer 23 with respect to the liquid droplet is expressed with a following expression.

$$\cos\theta = S1 \times \cos\theta 1 + S2 \times \cos\theta 2$$

In the case of the air layer, θ2=180°. Therefore, the contact angle θ of the water repellent layer 23 can be increased by decreasing the top surface ratio S1 of the protruded portions 235.

An alloy 94 made of plasma ions 92 and metallic atoms 93 of the substrate 231 is formed on the top surface of the protruded portion 235 as shown in FIG. 5. The size of the fine top surface is decided by the size of the alloy 94. In the present embodiment, the gallium (Ga) ion is used as the plasma ion 92 and the magnesium is used as the atom 93 of the water repellent layer 23.

In the asperity structure having such the protruded portions 235, the contact angle θ of the water repellent layer 23 can be made larger than 90° even if the true contact angle of the metallic material of the substrate 231 is equal to or smaller than 90°. Therefore, the contact angle θ of the water repellent layer 23 can be increased and the excellent water repellency can be added to the water repellent layer 23 irrespective of whether the metallic material of the substrate 231 has the water repellency or a hydrophilic property.

The fine asperities including the protruded portions 235 give the water repellency to the water repellent layer 23. Therefore, the water repellent layer 23 is constituted by the metal of the substrate 231 and the alloy 94 of the metal. The water repellent layer 23 is not constituted by the organic substances such as the FAS coating of the conventional technology but is constituted by the inorganic substances containing the metal of the substrate 231. Therefore, the heat resistance can be improved as compared to the water repellent layer consisting of the organic substances such as the FAS coating.

The above is explanation of the characteristic construction of the injector 10. Next, a formation method of the injection hole plate 20 having the water repellent layer 23 will be explained with reference to FIGS. 7 to 8C.

(Formation Method of Injection Hole Plate 20 having Water Repellent Layer 23)

The formation process of the injection hole plate 20 includes a main body portion forming process, a substrate deposition process and a plasma etching process.

(Main Body Portion Forming Process)

The main body portion forming process forms the main body portion 22 from the stainless steel (SUS). The injection holes 21 are formed in the main body portion 22 by press working or the like. In the case where the water repellent layer 23 is formed on the injection hole inner wall surface 21c of the injection hole 21, an internal diameter of the injection hole 21 is formed to be larger than the optimum internal diameter of the injection hole 21, which is decided from required engine performance, in consideration of thickness of the water repellent layer 23.

Hereafter, an example of forming the water repellent layer 23 only on the outer wall surface 27 of the injection hole plate 20 will be explained for the sake of conciseness of the explanation.

(Substrate Deposition Process)

The substrate 231 made of the magnesium is deposited on the surface of the main body portion 22 of the injection hole plate 20. The deposition of the substrate 231 onto the main body portion 22 is performed by deposition processing such as plating processing or sputtering processing. Thus, the substrate 231 as the base of the water repellent layer 23 is deposited on the outer wall surface 27. The injection hole plate 20 has the substrate 231 covering the outer wall surface 27 and corresponds to a covered member.

(Plasma Etching Process)

Figure 7:
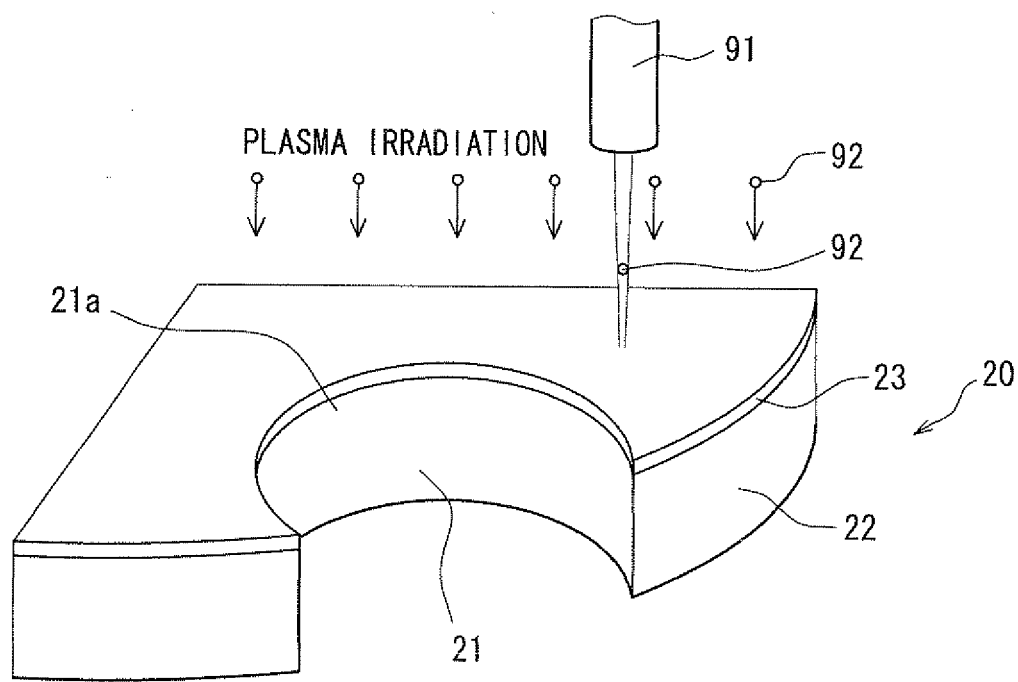
FIG. 7 is a diagram showing a formation process of the water repellent layer of the injection hole forming section according to the embodiment.

In the plasma etching process, a metal surface 232 of the substrate 231 of the injection hole plate 20 is irradiated with the plasma ions 92 using a processing equipment 91 shown in FIG. 7. The plasma ions 92 emitted from the processing equipment 91 are the gallium ions. The processing equipment 91 has a vacuum device that accommodates the injection hole plate 20 and a support member (not shown) and that provides the vacuum. The processing equipment 91 generates a plasma and gives a kinetic energy to the plasma ions 92 under a gas atmosphere of the argon (Ar), the nitrogen (N) or the like.

The kinetic energy, which the processing equipment 91 gives to the plasma ions 92, is adjusted to a kinetic energy that is larger than an energy for film forming for attaching the plasma ions 92 to the substrate 231 and that is smaller than an energy for performing ion implantation of the plasma ions 92 into the substrate 231.

Figure 8A:
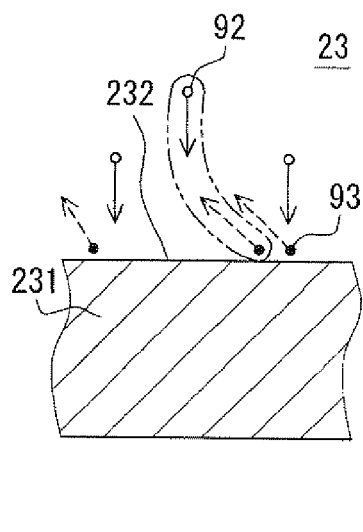
FIGS. 8A to 8C are diagrams showing etching processes using plasma ions for forming the asperities in the water repellent layer according to the embodiment.
Figure 8B:
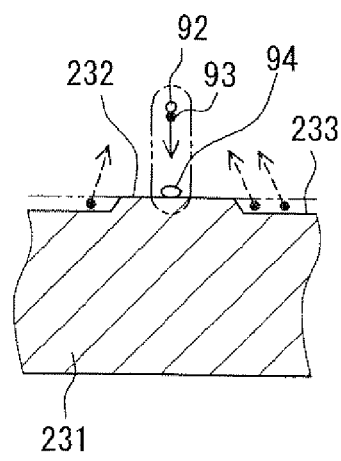
Figure 8C:
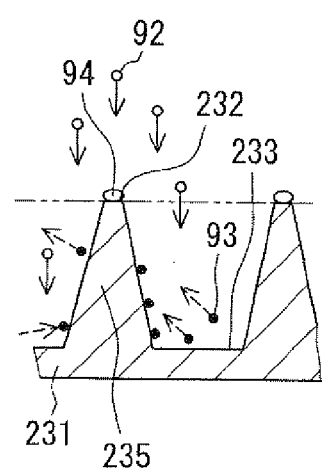

The plasma ion 92 emitted from the processing equipment 91 to the substrate 231 has the kinetic energy for etching the substrate 231 as shown in formation processes of the water repellent layer 23 of FIGS. 8A to 8C.

As shown in the etching initial process of FIG. 8A, the plasma ion 92 emitted from the processing equipment 91 approaches the metal surface 232 of the substrate 231 at high speed and collides with the atom 93 of the metal surface 232, thereby flicking off the atom 93. The plasma ion 92 flicks off the atom 93 and is also flicked off, whereby the plasma ion 92 moves away from the metal surface 232. A portion of the metal surface 232 where the atom 93 was flicked off is etched.

As shown in areas encircled by chain double-dashed lines in FIGS. 8A and 8B, there is a case where a part of the atoms 93 flicked off by the plasma ions 92 is irradiated again and collides with the plasma ion 92 approaching the metal surface 232 at the high speed. At that time, differently from the case where the plasma ion 92 collides with the atom 93 in the crystal of the substrate 231, a particle of an alloy 94 is formed by the collision between the atom 93 having the energy heightened by the collision and the plasma ion 92.

A kinetic energy of the particle of the alloy 94 formed by the collision is smaller than the kinetic energy of the plasma ion 92. The kinetic energy of the particle of the alloy 94 is smaller than the energy capable of flicking off the atom 93. Therefore, even if the particle of the alloy 94 reaches the metal surface 232 of the substrate 231, the particle adheres to the metal surface 232 and is fixed there.

The alloy 94 having deposited on the metal surface 232 of the substrate 231 is less apt to be etched by the plasma ion 92 than the atom 93 in the crystal of the substrate 231. In other words, as shown in FIGS. 8B and 8C, the etching is promoted by the collision of the plasma ion 92 to the metal surface 232 in a surface portion of the metal surface 232, where the alloy 94 is not formed. The surface portion of the metal surface 232 where the alloy 94 is not formed is etched more deeply than the surface portion of the metal surface 232 where the alloy 94 is formed. Thus, the depressed portions 233 are formed.

There is a case where a part of the atoms 93 flicked off by the plasma ions 92 in the depressed portion 233 adheres to a side wall surface of the protruded portion 235 again between the processes of FIGS. 8B and 8C. A possibility that the atom 93 flicked off adheres to the side wall surface of the protruded portion 235 again is relatively high on a bottom side of the depressed portion 233.

In this way, the surface portion where the alloy 94 is formed is not etched. Thus, the protruded portions 235 of the fine asperities can be surely formed. As described above, the air layer is formed among the protruded portions 235 in the fine asperities. Thus, the water repellent layer 23 having the excellent water repellency can be formed by forming the fine asperities on the surface of the substrate 231.

Figure 9:
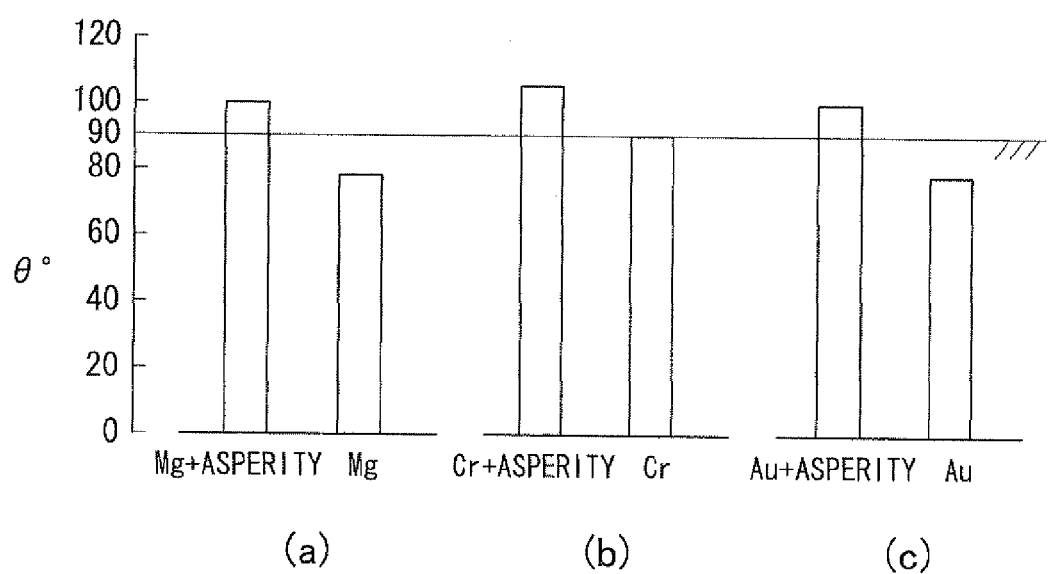
FIG. 9 is a diagram showing an effect of the asperity structure on the contact angle according to the embodiment and modified embodiments of the present invention.

The inventors of the present invention measured the contact angle θ of the water repellent layer 23 according to the present embodiment. A left bar graph in part (a) of FIG. 9 shows the contact angle θ° in the case where the asperity structure is formed on the substrate 231 made of the magnesium metal material. A right bar graph in part (a) of FIG. 9 shows the contact angle θ° in the case where the asperity structure is not formed on the substrate 231 made of the magnesium metal material. Although the true contact angle θ1 of the magnesium is approximately 80°, the contact angle θ of the water repellent layer 23 having the asperity structure including the protruded portions 235 according to the present embodiment sufficiently exceeds 90° and can reach approximately 100°.

The protruded portion 235 in the fine asperities is formed in the shape of the columnar protrusion extending along the conical shape. Therefore, when the deposit or the residual fuel adheres to the asperity structure, a ratio of the adhesion to the protruded portions 235 can be effectively reduced as compared to a ratio of the adhesion to the air layer existing among the protruded portions 235. Accordingly, such the water repellent layer 23 can improve the water repellency and can eventually heighten the effect of the deposit adhesion inhibition.

In the case where the metallic material of the substrate 231 is the magnesium, it is preferable to provide a heating oxidization process for heating and oxidizing the substrate 231 of the injection hole plate 20 in an oxidizing atmosphere after the above-described plasma etching process is completed. Thus, the water repellent layer 23 of the injection hole plate 20 can improve the durability concerning oxidation resistance and heat resistance and can ensure the inhibition of the deposit adhesion to the injection hole.

In the above-described present embodiment, a part of the injection hole plate 20 other than the main body portion 22 is formed of the metal substrate 231. Therefore, only the part where the water repellent layer 23 is necessary in the injection hole plate 20 can be constituted by the metal substrate 231. Therefore, the injection hole plate 20 having the water repellent layer 23 provided by the metal substrate 231 can reduce the amount of the metal material used in the metal substrate 231.

The main body portion 22 of the injection hole plate 20 is formed of the stainless steel. Alternatively, the main body portion 22 of the injection hole plate 20 can be formed of an iron-based base material containing the iron such as the stainless steel.

The above-described embodiment is suitably applied to the injector 10 that has the injection holes 21 for injecting the fuel and that has the water repellent layer 23 at least on the injection hole inner wall surfaces 21c of the injection holes 21 and on the circumferences of the openings of the injection holes 21. In such the injector 10, the injection hole inner wall surfaces 21c of the injection holes 21 and the circumferences of the openings such as the outlet portions 21a of the injection holes 21 can maintain the deposit adhesion inhibition function over a long period of time.

(Other Embodiments)

The present invention is not limited to the above-described embodiment. The present invention can be applied to various embodiments as follows, for example.

(1) In the above-described embodiment, the gallium ion is used as the plasma ion 92 and the magnesium is used as the atom 93 of the substrate 231 and the water repellent layer 23. The plasma ion 92 is not limited to the gallium ion. Any plasma ion may be used if the plasma ion forms an alloy with the atom of the metal constituting the substrate 231.

(2) The atom 93 may be the chromium (Cr) instead of the magnesium. The true contact angle θ1 of the chromium is approximately 92°. The contact angle θ of the water repellent layer 23 having the asperity structure including the protruded portions 235 reaches approximately 105° as shown in part (b) of FIG. 9, thereby effectively heightening the water repellency of the water repellent layer 23.

(3) In the case where the metallic material of the above-described substrate 231 is the chromium, there is no need to provide the heating oxidization process after the end of the plasma etching process. Therefore, the process for forming the water repellent layer 23 of the injection hole plate 20 can be simplified.

(4) The metallic material of the above-described substrate 231 may be the gold (Au). In this case, although the true contact angle θ1 of the gold is approximately 80°, the contact angle θ of the water repellent layer 23 having the asperity structure including the protruded portions 235 can be heightened to approximately 100° as shown in part (c) of FIG. 9.

(5) In the above-described embodiment, when the metallic material of the substrate 231 is the magnesium, the heating oxidization process is provided after the end of the plasma etching process. The metallic material of the substrate 231 is not limited to the magnesium. The metallic material of the substrate 231 may be at least a metal material selected from a metallic material group consisting of the aluminum (Al), the silver (Ag), the zinc (Zn), the nickel (Ni) and the copper (Cu).

Accordingly, at least a metallic material selected from the metallic material group consisting of the aluminum, the silver, the zinc, the nickel, the copper and the magnesium can be used as the metal, which collides with the plasma ion to form the alloy.

Each of the above-described aluminum, the silver, the zinc, the nickel, the copper and the magnesium has relatively low oxidation resistance. Therefore, the construction providing the heating oxidization process after the end of the plasma etching process can improve the durability concerning the oxidization resistance and the heat resistance and ensure the inhibition of the deposit adhesion to the injection hole 21 at the same time.

(6) The gold or the chromium is used as the metallic material of the substrate 231 in the above-described embodiment. Not only the gold but also at least a metallic material selected from a metallic material group consisting of precious metals such as the platinum (Pt), the iridium (Ir), the palladium (Pd) and the rhodium (Rh) may be used.

Not only the chromium but also at least a metallic material selected from a metallic material group consisting of metals having relatively high oxidation resistance such as the titanium (Ti) may be used.

Also, at least a metallic material selected from a metallic material group consisting of metals having relatively high melting points such as the tungsten (W), the molybdenum (Mo), the tantalum (Ta), the niobium (Nb) and the rhenium (Re) may be used.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A formation method for forming a water repellent layer on a surface of a metal substrate by applying plasma ions, the method comprising:
    forming alloy particles from a metal of the metal substrate and the plasma ions on a surface of the metal substrate, by applying plasma ions;
    etching portions of a surface of the metal substrate where the alloy particles are not formed, by applying plasma ions; and
    generating asperities by portions of the surface of the substrate where the alloy particles are formed and the portions etched, wherein the asperities provide the water repellent layer.

2. The formation method as in claim 1, wherein the asperities include protruded portions, each of which is formed in the shape of a columnar protrusion extending along a conical shape.

3. The formation method as in claim 1, wherein
    the metal is at least a metallic material selected from a metallic material group consisting of aluminum, silver, zinc, nickel, copper and magnesium.

4. The formation method as in claim 3, further comprising:
    heating and oxidizing the metal substrate in an oxidizing atmosphere after generating the asperities.

5. The formation method as in claim 1, wherein
    the metal is at least a metallic material selected from a metallic material group consisting of platinum, iridium, gold, palladium and rhodium, a metallic material group consisting of tungsten, molybdenum, tantalum, niobium and rhenium or a metallic material group consisting of chromium and titanium.

6. The formation method as in claim 1, wherein the water repellent layer is formed on a surface of a covered member that has an inner main body and the metal substrate covering a surface of the inner main body.

7. The formation method as in claim 6, wherein
    the inner main body of the covered member is made of an iron-based metal material including iron.

8. An injector having an injection hole for injecting fuel, the injector comprising:
    a water repellent layer provided at least on an injection hole inner wall surface of the injection hole and a circumference of an opening of the injection hole, wherein the water repellent layer is formed by the formation method as in claim 1.

9. The formation method as in claim 1, wherein the step of etching portions of the surface of the metal substrate comprises applying plasma ions to the surface of the metal substrate, wherein a kinetic energy of the plasma ions is larger than an energy for film forming for attaching the plasma ions to the metal substrate and is smaller than an energy for performing ion implantation of the plasma ions into the metal substrate.

10. The formation method of claim 9, wherein the etching occurs as a result of an atom of the plasma ions colliding with an atom of the metal surface and removing from the metal surface the atom of the metal surface.

11. The formation method of claim 10, wherein the removed atom of the metal surface collides with a plasma ion and forms an alloy, such that the alloy adheres to the surface of the metal substrate.

12. The formation method of claim 11, wherein the adhered alloy on the surface of the metal substrate is less susceptible to being removed by a plasma ion than the atom of the metal surface, such that etching does not occur on portions of the surface of the metal substrate having the alloy.

13. The formation method as in claim 9, further comprising applying gallium ions under a vacuum and under a gas atmosphere consisting of an inert gas.

14. The formation method as in claim 13, wherein the inert gas comprises argon or nitrogen.

15. The formation method as in claim 9, wherein the plasma ions comprise gallium ions.

* * * * *